United States Patent
Djajadiningrat et al.

(10) Patent No.: US 11,754,649 B2
(45) Date of Patent: Sep. 12, 2023

(54) SENSOR SYSTEM FOR INCREASING SECURITY IN MR ENVIRONMENTS

(71) Applicant: KONINKLIJKE PHILIPS N.V., Eindhoven (NL)

(72) Inventors: Johan Partomo Djajadiningrat, Utrecht (NL); Michael Gunter Helle, Hamburg (DE); Gereon Vogtmeier, Aachen (DE); Steffen Weiss, Hamburg (DE); Jaap Knoester, Utrecht (NL)

(73) Assignee: Koninklijke Philips N.V., Eindhoven (NL)

( * ) Notice: Subject to any disclaimer, the term of this patent is extended or adjusted under 35 U.S.C. 154(b) by 98 days.

(21) Appl. No.: 17/615,846

(22) PCT Filed: Jun. 2, 2020

(86) PCT No.: PCT/EP2020/065156
§ 371 (c)(1),
(2) Date: Dec. 2, 2021

(87) PCT Pub. No.: WO2020/245091
PCT Pub. Date: Dec. 10, 2020

(65) Prior Publication Data
US 2022/0308135 A1    Sep. 29, 2022

(30) Foreign Application Priority Data
Jun. 4, 2019 (EP) .................................... 19178132

(51) Int. Cl.
*G01R 33/28* (2006.01)
*G01R 33/038* (2006.01)

(52) U.S. Cl.
CPC ......... *G01R 33/288* (2013.01); *G01R 33/038* (2013.01)

(58) Field of Classification Search
CPC ........................... G01R 33/288; G01R 33/038
USPC ......................................................... 324/318
See application file for complete search history.

(56) References Cited

U.S. PATENT DOCUMENTS

| | | | |
|---|---|---|---|
| 4,060,039 | A | 11/1977 | Lagarrigue |
| 4,795,995 | A | 1/1989 | Eccleston et al. |
| 4,990,850 | A | 2/1991 | Votruba |
| 5,841,346 | A | 11/1998 | Park |
| 2004/0135687 | A1 | 7/2004 | Keene |
| 2005/0242817 | A1 | 11/2005 | Hoult |

(Continued)

FOREIGN PATENT DOCUMENTS

| | | | |
|---|---|---|---|
| DE | 202014009752 A | 12/2014 | |
| EP | 3748383 A1 * | 12/2020 | ........... G01R 33/038 |

(Continued)

OTHER PUBLICATIONS

Keene "Using Ferromagnetic Detection Systems in MRI Environment" Bioeffects, Safety and Patient Managment 2014 p. 299-327.
(Continued)

*Primary Examiner* — Christopher P McAndrew

(57) ABSTRACT

The invention is directed to a sensor system (100) for increasing security of a use of at least one magnetic object (102) in vicinity of an MR imaging device (200), wherein at least one magnetic property of the magnetic object (102) can be measure and evaluated in order to increase the safe use of the magnetic object (102) within MR environments.

13 Claims, 2 Drawing Sheets

(56) References Cited

U.S. PATENT DOCUMENTS

| | | | |
|---|---|---|---|
| 2009/0266887 A1* | 10/2009 | Molyneaux | G01R 33/288 |
| | | | 235/382 |
| 2015/0301216 A1* | 10/2015 | Hautson | G01V 3/081 |
| | | | 324/247 |
| 2016/0306062 A1 | 10/2016 | Keene et al. | |
| 2017/0234945 A1 | 8/2017 | Findeklee et al. | |
| 2018/0158307 A1 | 6/2018 | Keene et al. | |

FOREIGN PATENT DOCUMENTS

| | | |
|---|---|---|
| JP | 2008017989 A | 1/2008 |
| WO | 2015071796 A1 | 5/2015 |

OTHER PUBLICATIONS

International Search Report and Written Opinion From PCT/EP2020/065156 dated Dec. 10, 2020.
Stephanie Pappas "Man Dies in MRI Accident How Does this Happen" Live Science Jan. 29, 2018.
Peggy Peck "Fatal MRI Accident First of its Kind" Web MD, Aug. 1, 2001.

\* cited by examiner

SENSOR SYSTEM FOR INCREASING SECURITY IN MR ENVIRONMENTS

CROSS REFERENCE TO RELATED APPLICATIONS

This application is a U.S. national phase application of International Application No. PCT/EP2020/065156 filed on Jun. 2, 2020 which claims the benefit of EP Application Serial No. 19178132.7 filed on Jun. 4, 2019 and is incorporated herein by reference.

FIELD OF THE INVENTION

The present invention is directed to a sensor system for increasing security of a use of at least one magnetic object in vicinity of a MR imaging device, a method for detecting a magnetic object in a vicinity of a MR imaging device, a computer program element and a MR imaging device for acquiring MR images.

BACKGROUND OF THE INVENTION

Magnetic objects pose a safety risk in magnetic resonance (MR) imaging environments. In the case that the magnetic objects get too close to the MR scanner, the magnetic field of the MR scanner will cause them to be pulled into the bore of the MR scanner with forces that can be much larger than their weight. Such objects are therefore not allowed inside the MR exam room. Patients and clinicians are made aware of the risk and are warned to leave such objects outside of the exam room. However, there are a number of situations in which the safety measures are violated and respective devices are brought into to the sphere of the MR scanner. For example, in an emergency situation, metal objects needed to attend to the patient (e.g. an oxygen tank) will be brought into the MR room as the necessity outweighs the risk. Also, personnel unfamiliar with the MR environment, for example non-clinicians like cleaning personnel and the like, are not aware of the risk which magnetic objects in the surrounding of the MR imaging device can bear. Whilst small objects can be removed by hand, bigger objects that are caught in the bore need to be pulled away. In the worst-case scenario, an accident may require to an emergency shut-off the magnetic field. The emergency shut-off is typically very costly, as it involves the immediate release of vast amounts of liquid helium into the atmosphere and requires refill and setting up the MR device from scratch, which is a time-consuming process.

EP 3 072 293 discloses a magnetic resonance imaging (MRI) location surveillance system for determining access to a room.

JP 2008 017989 discloses a magnetic field generator and its detector, which are provided near the door of an antechamber facing an MRI room through the door.

US 2005/242817 discloses an apparatus for detecting a potentially dangerous ferromagnetic object carried inadvertently by a person approaching the magnet of a magnetic resonance imaging system.

DE 20 2014 009752 discloses a fine balance with which you can measure at least thousandths of a gram unit.

SUMMARY OF THE INVENTION

The object of the present invention may be seen in the increase of the safety during using MR imaging devices and in the surrounding of MR imaging devices.

The problem is solved by the subject matter of the independent claims. Further embodiments and advantages of the present invention are incorporated in the dependent claims and the description.

Technical terms are used in their common sense. If a specific meaning is conveyed to certain claims, definition of terms will be given in the following in the context of which the terms are used.

According to a first aspect of the present invention, a sensor system for increasing security of a use of at least one magnetic object in vicinity of an MR imaging device comprises:
- at least one sensor device,
- a signal generation device,
    wherein the sensor device is configured for determining at least one magnetic property of said magnetic object, wherein the sensor system is configured for determining a maximum magnetic field strength to which the magnetic object shall be exposed based on the determined at least one magnetic property of said magnetic object,
    wherein the sensor device comprises a tracking device, which is configured for determining a distance between the magnetic object and the MR imaging device,
    wherein the sensor system is configured for calculating a threshold distance between the magnetic object and the MR imaging device based on the at least one magnetic property of the magnetic object and/or the determined maximum magnetic field strength,
    wherein the sensor system is configured for comparing the distance between the magnetic object and the MR imaging device to the threshold distance, and
    wherein the signal generation device is configured for generating a signal when the distance is equal or less than the threshold distance.

The advantage of said sensor system can be that the magnetic object can be detected such that the MR scanner does not influence or interfere with the magnetic object such that the magnetic object can be used effectively. Furthermore, the sensor system can have the advantage that by assessing the magnetic property of the magnetic object, a form of threat level can be assessed and thereby the sensor system can warn supervising personnel by generating a corresponding signal. Furthermore, the detected magnetic object can be outputted on AR or VR glasses or for example on luminous flooring. This cannot only save personnel effort but also can facilitate save use of magnetic objects in MR environments.

In other words, the sensor system is capable of detecting a magnetic object, for example a ferromagnetic object, and is configured to determine the at least one magnetic property, for example a magnetic flux density, of the magnetic object. The magnetic object can be a paramagnetic, a diamagnetic, an antiferromagnetic, a ferrimagnetic and/or an electromagnetic object, or an object showing any other kind of magnetism.

The aforementioned sensor device, which is configured for determining at least one magnetic property of said magnetic object, can comprise in an embodiment a system, which knows a type, a property and/or a location of the magnetic object in order to determine the at least one property of the magnetic object. The system can be for example a RIS console and/or an implant information database, in particular ScanWise by Philips (https://www.u-sa.philips.com/healthcare/education-resources/technologies/mri/scanwise-implant).

Furthermore, the sensor system can further comprise a input interface, which is configured for receiving an input indicative of the magnetic property of the magnetic object located within a person, for example an implant or magnetic remains of an accident. In other words, the person has an implant, which can comprise a communication module, and/or holds a certificate, which describes the magnetic property of the implant. By inputting the at least one magnetic property from the certificate of the implant or via data transfer between the implant and the input interface into the input interface, the sensor system receives the magnetic property of the magnetic object, in this case the implant. Furthermore, the sensor system as described before and hereinafter, can be configured for receiving the magnetic property from a certificate and/or an implant in order to determine the maximum magnetic field strength as described herein. In other words, based on the magnetic property received from the implant and/or the certificate a maximum field strength can be calculated. In addition, the sensor system as described herein can determine based on the maximum field strength, whether the person can be examined with a MR imaging device or can be present in the surrounding of the MR device and to which distance the person can approach the MR device. Furthermore, the sensor system can be configured for determining the magnetic property by accessing a database. In other words, the sensor system as described herein, may gather the magnetic property from a network, for example a website, by looking up the magnetic property of the implant on the website and transferring the looked-up information into the input interface. Further information of the implant can be transferred from the certificate or via the data transfer into the input interface, like a position of the implant, a weight of the implant, and/or sensor data acquired by the implant, to be able to improve the calculation results of the maximum field strength to which the implant may be exposed.

Alternatively or in addition, the system can use data from an electronic medical record (EMR) and screens for information on metal objects, e.g. metal hip implant, metal chips inside a person from e.g. a previous accident, which can be implemented in the calculation of the maximum field strength. According to an exemplary embodiment, the sensor system can be configured for determining the magnetic property of the magnetic object by accessing an electronic medial record (EMR) of a patient. In other words, the magnetic property can be received by the input interface from a patient file and/or an EMR. The input interface can receive patient data from the EMR, such that the sensor system receives via the input interface the type of implant or magnetic remains inside the body of the person from the EMR and subsequently the sensor system can look up the magnetic property, weight and the like of the implant from a network and/or a database. This embodiment can have the advantage that the measured magnetic property can be double-checked with the help of the test field generator and the results of the calculation of the maximum field strength can be improved.

Further, in another exemplary embodiment the sensor system is further configured for providing instructions to a user, where the magnetic object can still be safely positioned in the MR examining room. Therefore, in this embodiment the sensor system may comprise a projector, display and/or AR systems to display the safe zone for a specific patient, implant and/or magnetic object. In more detail, the sensor system can comprise an optical indicator, which is configured for displaying an indicator indicative for the herein described threshold distance. The indicator can be for example a line or the like, which can be projected on the floor with the help of a projector. The line is indicative for a border, wherein on the one side of the border the magnetic object can be handled safely and on the other side of the border the magnetic object should be handled with special care.

Additionally, the sensor system can detect that the magnetic object can be made of a strong magnetic material and thereby determine the magnetic properties of the magnetic object. Depending on the magnetic property or properties of the magnetic object, the sensor system can determine a maximum magnetic field strength to which the magnetic object shall/may/can be exposed. For example, the sensor system has detected that the magnetic object is at least partially made out of a strong magnetic material, like e.g. iron or cobalt, and thereby can determine that the object can be easily pulled into a MR imaging device, in particular into the source of the magnetic field of the MR imaging device. Furthermore, the sensor system can calculate a maximum field strength of the magnetic field to which the magnetic object can be exposed. For example, the magnetic field has a magnetic field strength of about 2 T wherein the sensor system is capable of calculating that a maximum magnetic field strength for said magnetic object is for example 1 T. In the case that the magnetic object is carried into the sphere of the MR imaging device, a signal can be generated which can be used to e.g. alarm supervising personnel that the magnetic object should not be moved further into the direction of the MR imaging device. Thereby, a save use of the magnetic object in the MR environment can be provided.

The signal generated by the sensor system may be of different nature. A warning signal, like an alarm, may be one embodiment, but also highlighting or elucidating a section on the floor around the MR device may be seen as such a signal. This will be explained in more detail in the context of different embodiments hereinafter.

According to a further embodiment of the invention, the sensor device comprises a magnetic test field generator,
  wherein the magnetic test field generator is configured for generating a magnetic test field which exerts a magnetic force that attracts the magnetic object,
  wherein the magnetic test field generator is configured for changing the magnetic test field over a predetermined time period, and
  wherein the sensor system is configured for determining the at least one magnetic property of said magnetic object by analyzing a deviation of the magnetic test field during the change of the magnetic test field due to a presence of the magnetic object within the magnetic test field.

The advantage of this embodiment can be that the magnetic property of the magnetic object can be determined with the magnetic test field, which is generated by the magnetic test field generator. Therefore, a flexible and variable method is presented which can be used in many different applications.

The magnetic test field generator can be for example any sensor, which is capable to generate a magnetic field, which is able to have an influence, for example a magnetic force, onto a magnetic object. Furthermore, the sensor device can be any sensor device, which can comprise a sensor for determining a magnetic field strength and/or magnetic flux density in order to determine a change of the magnetic test field due to a presence of the magnetic object. Moreover, the sensor device can detect a deviation between the magnetic test field with the presence of the magnetic object and the magnetic test field without the presence of the magnetic object. In particular, the sensor device can determine a first value for the magnetic test field without the presence of the magnetic object and can determine a second value for the magnetic test field with the presence of the magnetic object. The sensor device can compare the first value to the second value and thereby determining the deviation and consequently the magnetic property of the magnetic object. The first and/or second value can be expressed via the magnetic field strength and/or the magnetic flux density but are not limited thereto since every measurement value which is able to determine a change in a magnetic field can be used. In other words, the sensor system can be configured for determining the magnetic property of the magnetic object by altering the magnetic test field and analysing the change of the weight of the magnetic object based on the altering of the magnetic test field. Thereby the magnetic property of the magnetic object can be determined. For example, the magnetic and test field generator can comprise a coil, which is capable of generating a magnetic test field.

According to an embodiment, the sensor device further comprises a balance/scale, wherein the balance is configured to measure a weight of the magnetic object. Furthermore, the sensor system is configured to determine the at least one magnetic property of said magnetic object based on the change of the weight of the magnetic object due to a change of the magnetic test field.

This embodiment can have the advantage that the at least one magnetic property and/or magnetic properties of the magnetic object can be assessed more reliable since a weight of the magnetic object can be determined. For example, the change of the magnetic test field can be correlated to the weight of the magnetic object to determine a magnetic property of the magnetic object.

The sensor system can be capable of measuring the at least one magnetic property and mass of a ferromagnetic object outside of the MRI exam room. Once the magnetic object has entered the exam room, users are alerted when the object is brought too close to the MR scanner. Measuring an object's magnetic properties may be done just before entering the exam room or—in the case of an emergency—ferromagnetic objects that are likely to be needed in an emergency case (e.g. an oxygen tank, an IV pole) need to be measured beforehand.

According to the first aspect of the present invention, the sensor device comprises a tracking device, which is configured for determining a distance between the magnetic object and the MR imaging device. Additionally, the sensor system is configured for calculating a threshold distance between the magnetic object and the MR imaging device based on the at least one magnetic property of the magnetic object. Moreover, the sensor system is configured for comparing the distance between the magnetic object and the MR imaging device to the threshold distance and to generate the signal when the critical distance is equal or less than a distance.

Said embodiment can provide the advantage that a magnetic object can be handled safely within the MR environment since a threshold distance between the magnetic object and the MR imaging device is monitored live. The threshold distance can mark the point when the magnetic force onto the magnetic object of the magnetic force is bigger than the gravitational force and therefore the magnetic object would be pulled into the MR device. By constantly determining the distance between the magnetic object and the MR imaging device, a signal only is generated when the distance is equal or less than a threshold distance.

In other words, the sensor device comprises a tracking device, which is capable of determining the distance between the magnetic object and the MR device such that a live position of the magnetic object or a live distance between the MR imaging device and the magnetic object is generated. Since the magnetic properties of the magnetic object and the maximum field strength to which the magnetic object should be exposed are known, a threshold value distance between the magnetic object and the MR imaging device can be calculated. By comparing the live position or live distance between the MR imaging device and the magnetic object, it can be detected when the threshold distance is equal or less such that the signal can be generated and the user of the magnetic object can be informed that it is critical to move the magnetic object further into the direction of the MR imaging device. According to an embodiment, the sensor system comprises VR and/or AR glasses. Furthermore, the sensor system is configured for displaying the distance between the magnetic object and the MR imaging device, the threshold distance, the shape of the magnetic object, a position of the magnetic object, a mass of the magnetic object, and/or the at least one magnetic property of the magnetic object on the VR and/or AR glasses.

This can have the advantage that the security of the users of magnetic objects in MR environments can be further increased since critical aspects can be displayed in the field of view of the user via VR and/or AR glasses.

In other words, a user of the magnetic object, wherein the magnetic object is for example a vacuum cleaner, can be informed of a critical situation when the vacuum cleaner is moved too near to the MR imaging device, by displaying a warning signal in the VR and/or AR glasses of the user. Additionally the threshold distance can be displayed permanently in the sight of view of the user via the VR and/or AR glasses.

According to an embodiment, the sensor system is configured for determining based on the at least one magnetic property of the magnetic object a risk value of the magnetic object. Furthermore, the signal generated by the signal generation device depends on the risk value.

This embodiment can have the advantage that a metal paper clip may not generate the signal because the risk value of a paper clip is too low to be a threat regarding the MR imaging devices or the patient lying in the MR imaging device. Therefore, the usability of the MR imaging device can be further improved.

In other words, the sensor system can determine the risk value for example based on the at least one magnetic property of the magnetic object, the change of the magnetic field and/or the weight of the magnetic object. The risk value can be for example indicative how likely an examination procedure of the MR device must be interrupted or cannot start due to the presence of the magnetic object. For example, in the case that the magnetic object is a metal paper clip, the risk value is low such that only a mild signal can be generated. Furthermore, in the case that a metal pen is taken into the MR environment, a signal, which can comprise for example an optical and acoustic warning, can be generated that a medium-sized object is brought into the MR environment. In the case that a high risk value magnetic object, e.g. an oxygen tank, is brought into the MR environment, the signal can be adapted accordingly and for example a loud alarm can be sounded.

According to an embodiment, the sensor system is configured for comparing the at least one magnetic property of the magnetic object to a plurality of magnetic properties of magnetic objects, which are stored in a database. Furthermore, the sensor system is configured for determining based on the comparison a type of object of said magnetic object.

This embodiment can have the advantage that for example standardized objects in the MR environment, for example a patient stretcher or an oxygen tank, can be identified based on their magnetic properties and for example threshold distances or exceptions can be looked up in the database. This reduces the effort for the personnel drastically, since the sensor system provides a reliable backup and source of information.

In other words, the sensor system can have access to a network, an internet or cloud based database or any other type of database, which can store a plurality of magnetic objects including their magnetic properties. For example, the sensor system can determine the at least one magnetic property of the magnetic objects, for example an oxygen tank, and then perform a look-up in the database to search for rules, restrictions and/or exceptions of said magnetic object for MR environments.

According to an embodiment, the sensor system comprises a camera, which is configured for generating at least one image of the magnetic object. Furthermore, the sensor system is configured for determining the at least one magnetic property of the magnetic object based on the generated image.

This embodiment can have the advantage that the reliability of the detection and determination of the at least one magnetic property of the magnetic object can be increased since a second layer of security is added by determining the at least one magnetic property of the magnetic object based on an acquired image within the MR environment.

For example, the camera of the sensor system can acquire an image wherein the sensor system is capable of performing image recognition such that, for example, a magnetic object can be detected in the image. Based on the magnetic object detection through the image recognition, the at least one magnetic property can be looked up in a database of the magnetic object. Alternatively, the magnetic object also can comprise for example a barcode wherein the camera is capable of detecting the barcode in the image, which is acquired, and the barcode comprises the at least one magnetic property of the magnetic object and/or identifies the magnetic object.

When a user is not aware that he is carrying a metal object or underestimates the risk of introducing a metal object, the user won't see a reason to measure at least one magnetic property of the magnetic object. In such cases, the sensor system can evaluate an image generated with a camera and may compare new objects entering the room to a database of ferromagnetic objects from which the magnetic properties of said object can retrieved. Objects may be recognized as a particular object (e.g. "A Nilfisk GM80 vacuum cleaner was detected") or an object of a certain category (e.g. "Detecting a type of belt clip, a type of pen"). The sensor system can assume the worst case scenario, e.g. it assumes that the object has the highest threat level or risk value and a corresponding signal can be generated.

According to an embodiment, the sensor system comprises a sound outputting device. Furthermore, the generated signal by the signal generation device is an acoustic signal, which is outputted via the outputting device. Moreover, the signal generation device is configured for generating the acoustic signal depending on the at least one magnetic property of the magnetic object.

This can have the advantage that a user of the MR imaging device can be informed throughout a loudspeaker that magnetic object is in the range of the magnetic field, which is generated by the MR imaging device. Furthermore, the acoustic signal can be adapted dependent on the risk level. For example, when a medium-sized object like a pen is detected, a mild acoustic signal is played. In case a heavy magnetic object is detected, a loud acoustic signal is played.

In other words, the sensor system comprises a sound outputting device like a speaker or the like. An acoustic signal can be emitted via the speaker into the MR environment in case the signal is generated, a threshold distance of the magnetic object is broken through or any other acoustic signal is outputted based on the magnetic properties of the magnetic object.

According to an embodiment, the sensor unit is configured for determining a factor influencing the at least one magnetic property of the magnetic object. Moreover, the factor influencing the at least one magnetic property is selected from the group comprising a mass of the object, a shape of the object, a magnetic characteristic of the object, a material of the object, an acceleration of the object, a permeability of the object and/or a magnetic flux density.

In other words, the sensor unit is capable of detecting several factors for example like the shape of the object which has an influence on the at least one magnetic property of the magnetic object. The factor can also be used to determine a risk value of the magnetic object.

A further aspect of the invention is a method for detecting a magnetic object in a vicinity of an MR imaging device. The method comprises the steps of:

Determining at least one magnetic property of said magnetic object,

Determining a maximum magnetic field strength to which the magnetic object may be exposed based on the determined at least one magnetic property of said magnetic object, Determining a distance between the magnetic object and the MR imaging device, Calculating a threshold distance between the magnetic object and the MR imaging device based on the at least one magnetic property of the magnetic object and/or the maximum magnetic field strength, Comparing the distance between the magnetic object and the MR imaging device to the threshold distance, and Generating a signal when the distance is equal or less than the threshold distance.

This embodiment can have the advantage that the usage of a magnetic object within the MR environment can be improved and the security can be increased, since the maximum magnetic field strength is calculated based on the at least one magnetic property of the magnetic objects and in the case that the magnetic object is going to be exposed to the maximum magnetic field strength a signal is generated.

In other words, the at least one magnetic property of a magnetic object which is moving towards or in the environment of the MR imaging device can be assessed and based on the at least one magnetic property a maximum magnetic field strength can be determined. The maximum magnetic field strength describes the magnetic force, which affects the magnetic object before the magnetic object is pulled into the MR imaging device, in particular the bore of the MR imaging device. In the case, that the magnetic object is moved towards the MR imaging device such that the magnetic object can be pulled into the MR imaging device because the force which applies on the magnetic object is nearly the same as the maximum magnetic field strength, a signal is generated to inform a user or surveillance personnel of the MR imaging device.

According to an embodiment, the method further comprises the step of:
generating a magnetic test field, and
measuring the magnetic force in particular when the magnetic force is based on a change of the magnetic test field due to a presence of the magnetic object and a weight of the magnetic object, of the magnetic object within the magnetic test field.

This can have the advantage that with the help of a magnetic test field, the at least one magnetic property of the object can be determined such that the use of the magnetic object in the MR environment can be improved in view of security aspects.

In other words, a magnetic test field is generated and used to measure the magnetic force of the magnetic object. The magnetic force can be based on a change of the magnetic test field due to a presence of the magnetic object and/or a weight of the magnetic object.

According to the invention, the method comprises the steps of:
determining a distance between the magnetic object and the MR imaging device,
calculating a threshold distance between the magnetic object and the MR imaging device based on the at least one magnetic property of the magnetic object,
comparing the distance between the magnetic object and the MR imaging device to the threshold distance, and
generating the signal when the critical distance is equal or less than the distance.

This can have the advantage that a magnetic object can be used in the MR environment securely since a system is provided which is capable of monitoring the movement of the magnetic object in the MR environment such that no accidental movement or the like triggers the magnetic object to be pulled into the MR imaging device by magnetic force.

In other words, a distance is monitored live between a magnetic object and the MR imaging device. Furthermore, a threshold distance can be calculated based on the at least one magnetic property of the magnetic object, which is indicative for a maximum field strength which can be applied onto the magnetic object before it gets pulled into the MR imaging device. Based on the threshold distance, a distance can be compared to the threshold distance such that a signal is generated when the threshold distance is undercut.

A further aspect of the invention is an MR imaging device for acquiring MR imaging wherein the MR imaging device comprises a sensor system as described before and hereinafter and a MR imaging acquisition device, which is configured to generate MR imaging images.

According to an embodiment, the sensor unit comprises a first sensor, which is configured for supervising a room in which the MR imaging device is located. Furthermore, the first sensor comprises an optical marker unit, which is configured for highlighting at least an optical indicator, in particular a borderline, on the floor based on the at least one magnetic property of said magnetic object. Additionally, the optical indicator is indicative of the threshold distance of the magnetic object.

In another exemplary embodiment, the sensor system is configured for projecting different areas indicating different risks onto the floor around the MR imaging device via the optical indicator. Thereby, different risk areas can be projected onto the floor based on the calculated maximum field strength, as described herein, and specific for a single or a plurality of magnetic objects, which is brought into the MR imaging device room. In particular, the different areas indicating different risks can comprise at least two areas, wherein a first area indicates a safe use of the magnetic object, and wherein the second area indicates a use of the magnet object with special care. The different risk areas can be coloured for example according to a traffic light system, wherein the magnetic object can be operated in the green zone safely. In the yellow zone, the magnetic object only should be handled with special care. The magnetic object should not enter or be located inside the red zone, since the red zone indicates the maximum field strength, in which the magnetic object may be pulled into the bore of the MR imaging device. The risk areas can be also displayed onto AR- and/or VR-glasses. Alternatively or in addition, the risk areas can be displayed with any suitable warning signal to the person, in particular any visual and/or acoustic signal.

This can have the advantage that with the help of the optical indicator, personnel in the MR environment can be informed about a threshold distance of the magnetic object in dependency of the MR imaging device. Thereby, the secure use of a magnetic object in the MR environment can be provided.

In other words, the first sensor comprises an optical marker unit, which can be for example a kind of projector or a laser projector which is able to show an optical indicator, for example a border line, on the floor which stands for a kind of red zone wherein the magnetic object cannot be handled. Additionally the sensor system can monitor an other room as the examination room. Outside of the MR exam room the magnetic properties and the mass of an object can be determined and a scanning of the shape of the object can take place. Furthermore, outside of the MR exam room the threat level or risk value of the magnetic object based on the magnetic properties can be determined. Accordingly, the maximum magnetic field strength to which the object may be exposed can be calculated. Inside the MR examining room the magnetic object can be identified and the position of the magnetic object can be tracked inside the MR examining room. Furthermore, the current field strength of the magnetic field calculated based on the current position of the magnetic object and can be compared to the maximum field strength to which the magnetic object may be exposed. In addition, users can be alerted when a ferromagnetic object comes too close to the scanner and point it out with optical indicators. Furthermore, the urgency of the alert can be adjusted to the potential threat posed by the magnetic object.

According to an embodiment, the sensor unit comprises at least one further sensor, which supervises a further room, in particular a preparation room and/or a supervisor room.

For example, a sensor system can be placed in at least the preparation room and the control room for the MR examination. This can combine two functionalities. First, the at least one magnetic property of the magnetic object can be measured and the contours of the magnetic object can be 3D scanned by means of a camera. The sensor system can include a balance and a coil that can produce a magnetic test field providing a magnetic field with a defined vertical field gradient, producing a defined attractional force. The weight of the magnetic object can be determined with and without this field gradient, and the magnetic object can be classified with respect to the ratio of the magnetic and gravitational forces. This ratio can be known as the relevant quantity to assess the MR safety or risk value of magnetic objects with respect to the attractional forces. Basically, if the magnetic force is lower than the gravitational force or lower by a user-defined factor, the magnetic object may be allowed in all areas within the MR suite. In case the magnetic force is higher than the gravitational force or a user defined force a signal can be generated to alarm the user. Additionally, identical medical devices may be used in many MR centers. Therefore, a cloud-based database of potentially dangerous objects can be provided and shared under the MR centers. The at least one magnetic property and shape information of every object which may be measured and scanned in this way can be added to the database. If the database is shared by MRI installations all over the world, every installation benefits from increased safety with every magnetic object scanned.

Based on the at least one magnetic property of the magnetic object and the determined mass of the magnetic object, the system can calculate the maximum magnetic field strength to which the object may be exposed. Magnetic objects which contain less ferromagnetic material (e.g. certain types of stainless steel) can be allowed to enter a zone with a higher magnetic field strength than objects which contain a higher amount of ferrous metal or are made of a more magnetic alloy.

Inside the exam room, a camera-based system can identify the object, retrieve its at least one magnetic property and can determine its spatial location. By using multiple cameras looking from different angles, the system can spot objects, which remain hidden from the technician's point of view.

Advanced systems may be able to even recognize objects, which are partially hidden, e.g. protruding partly from a shirt pocket.

Based on a model, which can take into account both the static and gradient field of the scanner, the total magnetic field strength at the location of the object can be calculated. When the total field strength exceeds the maximum allowed field strength for the magnetic object, the user can be alerted.

Patient and/or medical staff can be alerted to magnetic objects containing metal, which get too close to the scanner. For example, an augmented reality glasses can be provided, which can highlight the offending object. Furthermore, a luminous floor can be provided, which highlights where the object is and where the forbidden zone for this magnetic object is. Additionally or alternatively, a theatrical spotlight (a follow spot) can be provided which projects a bright beam of light on the offending magnetic object. Another example is a voice feedback system, which can describe the object and its location in words.

The way the user may be alerted can depend on the threat or risk value posed by a magnetic object: a less dangerous magnetic object may result in a soft alarm while a dangerous object may result in a highly urgent alarm (e.g. hairclip vs. oxygen cylinder).

A further aspect of the invention is a computer program element, when executed on a processing unit is configured to instruct the processing unit to perform the steps of the method as described before and hereinafter.

Another aspect of the invention is a computer-readable medium which is capable to store a computer program element as described before and hereinafter.

These and other features of the invention will become apparent from and elucidated with reference to the embodiments described hereinafter.

BRIEF DESCRIPTION OF THE DRAWINGS

Reference symbols used in the drawings and their meanings are listed in summary form in the list of reference symbols. In principle, identical parts are provided with the same reference symbols in the figures.

DETAILED DESCRIPTION OF EMBODIMENTS

Figure 1:
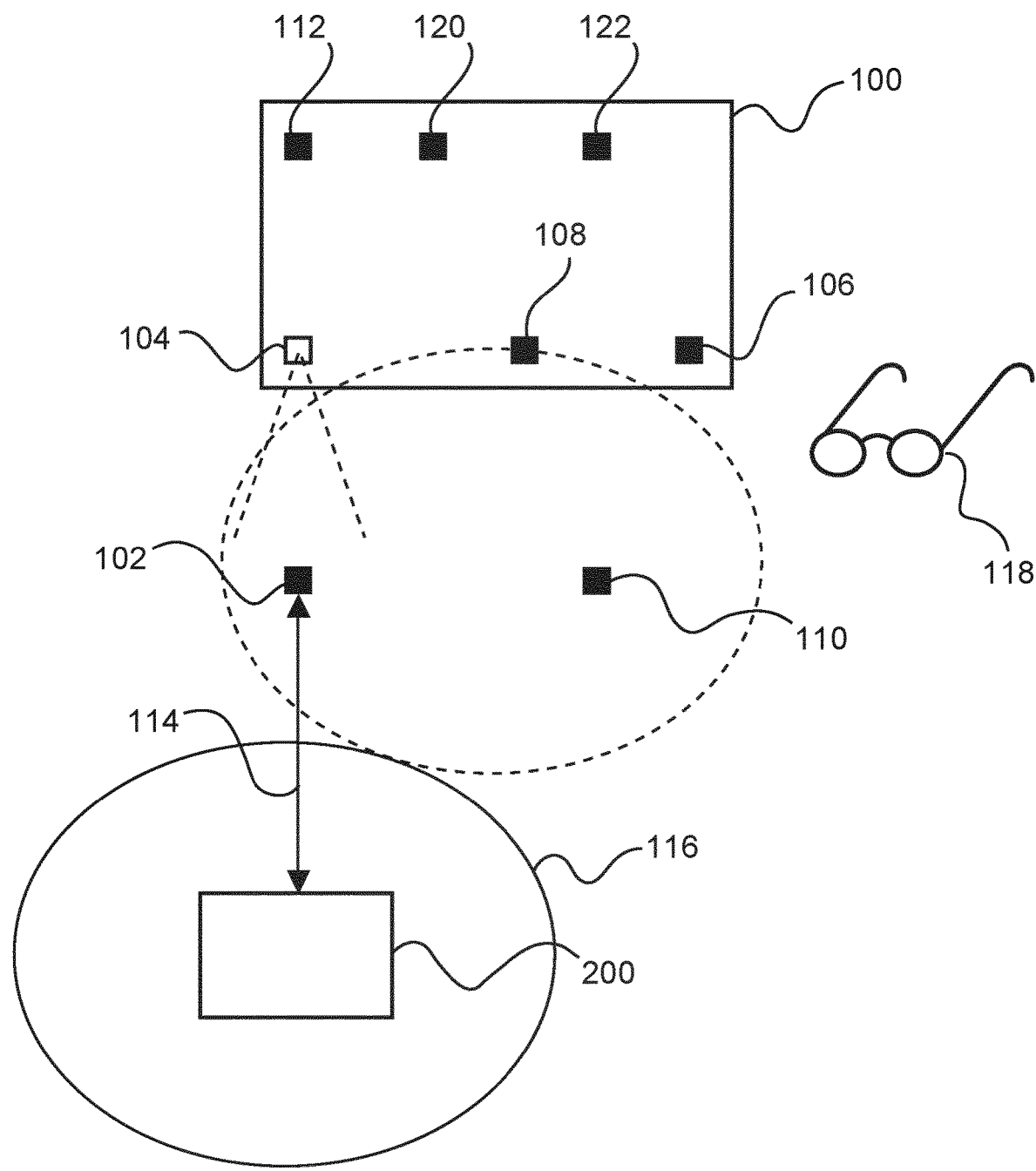
FIG. 1 shows a sensor system according to an embodiment of the present disclosure.

FIG. 1 shows a sensor system 100 according to an embodiment of the invention. The sensor system 100 increases the security of using of at least one magnetic object 102 in vicinity of an MR imaging device 200. The sensor system 100 comprises at least one sensor device 104 and a signal generation device 106. Furthermore, the sensor device 104 is configured for determining at least one magnetic property of said magnetic object 102. In addition, the sensor system 100 is configured for determining a maximum magnetic field strength to which the magnetic object 102 shall be exposed. Moreover, the signal generation device 106 is configured for generating a signal based on the determined maximum magnetic field strength for said magnetic object 102.

The advantage of said embodiment is that the magnetic object 102 can be detected such that the MR scanner does not influence or interfere with the magnetic object 102 such that the magnetic object 102 can be used effectively. Furthermore, the embodiment can have the advantage that by assessing the magnetic property of the magnetic object 102, a form of threat level can be assessed and thereby the sensor system 100 can warn supervising personnel by generating a corresponding signal.

In other words, the sensor system 100 is configured to survey a magnetic object 102 in the environment of a MR device 200. Accordingly, the sensor system 100 comprises at least one sensor device 104. The sensor device 104 can determine at least one magnetic property of the magnetic object 102. In addition, the sensor system comprises a signal generation device 106, which is capable of emitting a signal in case the magnetic object 102 comes to close to the MR device 200 and could be pulled into it. Furthermore, the sensor system 100 comprises a magnetic test field generator 108, which can generate a magnetic test field in which the magnetic object 102 may be positioned. The magnetic test field generator 108 can determine at least one magnetic property of the magnetic object 102. Additionally, the sensor system 100 comprises a balance/scale 110. The balance 110 can be positioned inside the magnetic test field of the magnetic test field generator 108 in order to determine at least one magnetic property of the magnetic object more precisely and/or to determine further at least one magnetic property of the magnetic object 102. Moreover, the sensor system 100 comprises at least one tracking device 112. The tracking device 112 can determine a position of the magnetic object 102. Based on the position of the magnetic object 102 and the MR device a distance 114 between the magnetic object 102 and the MR device 200 can be monitored. Furthermore, the sensor system 100 is capable of calculating a threshold distance 116 between the magnetic object 102 and the MR device 200. The threshold distance 116 can be indicative for the maximum field strength, which should be applied on the magnetic object 102. In the case the magnetic object 102 comes close to the threshold distance 116 the sensor system 100 in particular the signal generating device 106 can emit a signal to alarm a user of the MR device 200. In addition, the sensor system 100 comprises a VR and/or AR glasses 118. On the VR and/or AR glasses a variety of information can be displayed to a user in particular, the position of the magnetic object, the distance 114 and/or the threshold distance 116. In addition, the sensor system 100 comprises a camera 120. The camera 120 can acquire an image of the magnetic object 102 and the sensor system 100 can determine magnetic properties of the magnetic object 102 in the picture. Furthermore, the sensor system 100 comprises a sound outputting device 122. The signal generation device 106 can generate a signal, which alarms a user of the MR device in case a magnetic object 102 comes too close to the MR device 200. Said generated signal can be an acoustic signal and can be outputted via the sound outputting device 122.

Figure 2:
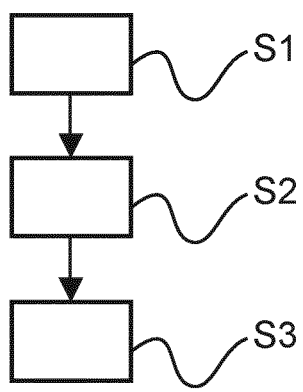
FIG. 2 shows a flow-chart illustrating a method according to a more detailed embodiment of the present disclosure.

FIG. 2 shows a flowchart of illustrating the steps of the method for detecting a magnetic object in a vicinity of a MR imaging device. The method comprises the step S1, wherein a magnetic property of the magnetic object is determined. In addition a maximum magnetic field strength is determined in step S2 to which the magnetic object shall be exposed. Moreover, in the step S3 a signal is generated, which is based on the determined maximum magnetic field strength for said magnetic object. For example, the step of determining the at least one magnetic property S1 of the magnetic object can be realized by the step of receiving an input indicative for the magnetic property of the magnetic object from a query of a database. For example, the database knows the type, the magnetic property, and/or the location of the implant and/or the metal object, of the specific person and/or of the implant of the specific person. The magnetic property can be determined by sending the query, which can comprise patient specific information, to said database and subsequently receiving the magnetic property of the specific person and/or the specific implant of the person. The database can be for example a RIS console and/or implant information database. Alternatively or in addition, the database can use data from an EMR.

In another embodiment, the step of generating a signal S3 as described herein, can be realized by displaying a safe zone for the specific magnetic object for which the maximum field strength has been calculated as described before and hereinafter, in particular by providing a projector, a display and/or an AR system.

Figure 3:
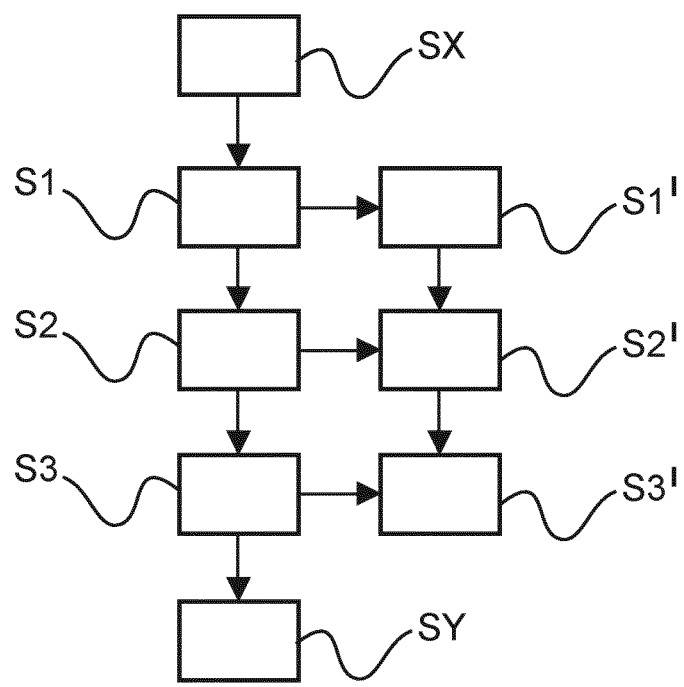
FIG. 3 shows a flow-chart illustrating steps of a method according to an embodiment of the present disclosure.

FIG. 3 shows a flowchart of illustrating further steps according to a more detailed method embodiment as compared to the method described in reference to FIG. 2.

For example, a magnetic test field can be generated in the method step S4. With the help of said magnetic test field, a magnetic force of the magnetic object can be measured in the step S5. The magnetic force can describe a correlation of a change in the magnetic test field due to a presence of the magnetic object and the weight of the magnetic object. Furthermore, step S6, can determine a distance between the magnetic object and the MR device. In addition, the step S7 can calculate a threshold distance between the magnetic object and the MR imaging device based on the magnetic properties of the magnetic object. Moreover, in the step of S8 a distance can be compared between the magnetic object and the MR imaging device to the threshold distance. Additionally, a signal can be generated in step 9, when the threshold distance is equal or less than the distance.

The shown method steps SX and SY can be substituted with any of the step S4-S9. In addition, any of the steps S4-S9 can be combined with the method steps S1-S3. This is shown by the method steps S1'-S3'. For example a combination of method steps S1 and S4 can be shown as method step S1'. Furthermore, several steps can be added to any of the steps S1-S3. For example the step S1 can be extended with the method steps S5 and S6. This combination is expressed by the method step S1' in FIG. 3.

Following the general description of the embodiment of FIG. 3 presented herein before, a further detailed embodiment of a method for detecting a magnetic object in vicinity of a MR imaging device will be described. For example, a situation is assumed in which the MR imaging device is positioned in a first room. Adjacent to the first room a preparation room is located. The MR imaging device comprises a sensor system and the sensor system has multiple inputs. One input comes from a plurality of cameras, which are located in the first room and the preparation room. Another input comes from the magnetic test field generator, which comprises a coil and a balance. A patient can enter the preparation room and the patient needs respiratory support. Thereby the patient carries an oxygen tank with him, and the oxygen tank is a magnetic object, which can be pulled into the MR device in case the oxygen tank comes to close to the MR device. In order to increase the security in the MR environment, the oxygen tank is examined by the magnetic test field generator as comprised in an embodiment of the present invention. Thereby at least one magnetic property of the oxygen tank is determined as was explained hereinbefore for e.g. step S1. In particular the magnetic force of the oxygen tank is measured (step S5) with the help of the magnetic test field generator. The oxygen tank is placed on the balance of the magnetic test field generator and subsequently, the weight of the oxygen tank is determined two times. First, the weight of the oxygen tank is determined when the magnetic test field generator generates a magnetic test field (S4). The magnetic test field has an influence on the weight of the oxygen tank and thereby the weight of the oxygen changes in comparison to the weight of the oxygen tank when no magnetic test field is generated. With the help of the comparison of the two weights of the oxygen tank a magnetic property of the oxygen tank is determined, which corresponds to step S1 as described before. The combination of the steps S1, S4, and S5 as just explained is illustrated by the step S1'.

The sensor system can then calculate the maximum magnetic field strength to which the oxygen tank should be exposed (step S2). In addition, the sensor system can identify the magnetic object with the help of the cameras and lookup in a database the magnetic properties of the oxygen tank. This is illustrated by the step S2'.

In this example, the maximum magnetic field strength to which the oxygen tank should be exposed is 1 Tesla. The MR device generates a magnetic field strength of 2 Tesla. The sensor system calculated that 1 Tesla acts on the oxygen tank in 1 meter distance to the MR device, thereby defining a threshold distance (step 7). With the help of the cameras, the sensor system can determine a distance between the oxygen tank and the MR device, which corresponds to step S6. In the case that the oxygen tank is moved towards the MR device the magnetic field strength which acts on the oxygen tank increases and accordingly the distance between the oxygen tank and the MR device decreases. The sensor system compares based on the current position of the oxygen tank and the magnetic field strength, which acts on it to the maximum field strength. Correspondingly, the sensor system compares the distance between the oxygen tank and the MR device to the threshold distance, which corresponds to step S8. In the case that the maximum field strength is reached and/or the distance is equal or less then the threshold distance, a loud acoustic alarm is generated by the sensor system (step S9), to inform supervising personnel that the oxygen tank is likely to be pulled into the MR device. The combination of the steps S3, S6, S7, S8 and S9 as described before are shown as step S3' in FIG. 3.

Figure 4:
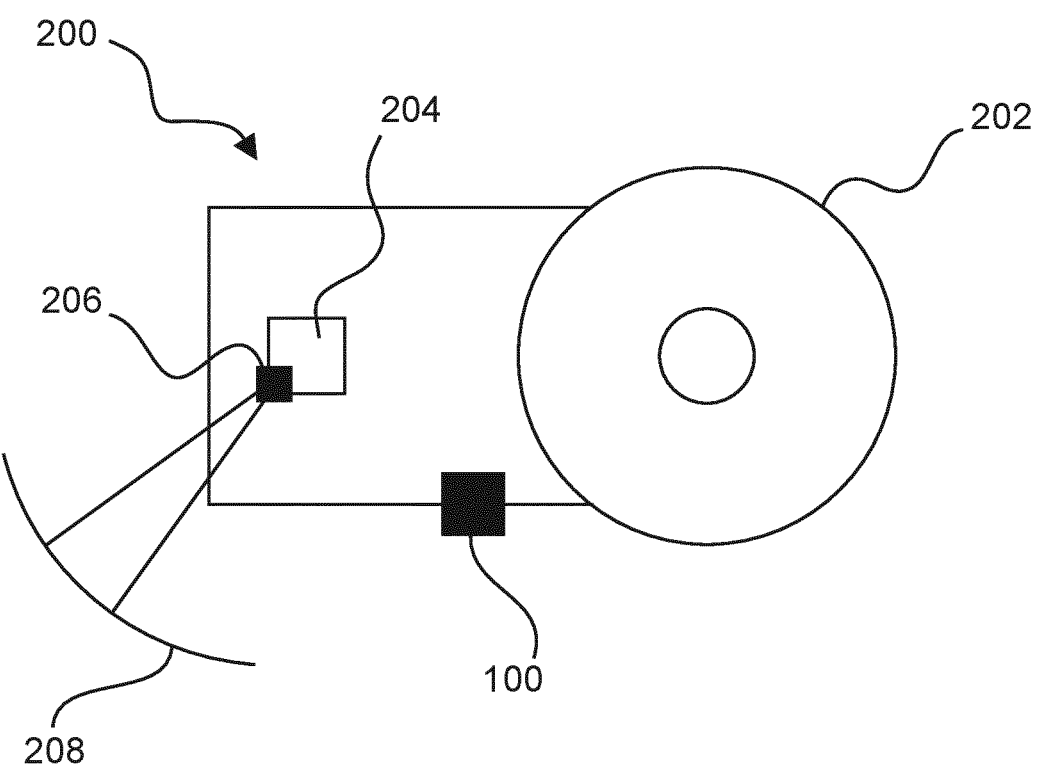
FIG. 4 shows an MR imaging device according to an embodiment of the present disclosure.

FIG. 4 shows an MR imaging device 200 according to an embodiment of the present invention. The MR imaging device 200 comprises a MR image acquisition device 202. Moreover, the MR imaging device 200 comprises a first sensor 204, which can supervise the room in which the MR imaging device 200 is located. In addition, the MR imaging device 200 can comprise a further sensor (not shown) which is capable of supervising a preparation room of the MR imaging device 200. In addition, the first sensor 204 comprises an optical marker unit 206. The optical marker unit 206 can generate or highlight an optical indicator 208 like for example a borderline. The optical indicator 208 can be indicative for the threshold distance. However, the optical indicator 208 can be positioned based on the magnetic properties of the magnetic object, such that the magnetic object can unlikely be pulled into the MR imaging device 200.

Where an indefinite or definite article is used when referring to a singular noun, e.g. "a", "an" or "the", this includes a plurality of that noun unless something else is specifically stated. Furthermore, the terms "first", "second", "third" and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover the invention is described in the following non-limiting points:

Point 1. Sensor system (100) for increasing security of a use of at least one magnetic object (102) in vicinity of an MR imaging device (200), the sensor system (100) comprising:
- at least one sensor device (104),
- a signal generation device (106),
- wherein the sensor device (104) is configured for determining at least one magnetic property of said magnetic object (102),
- wherein the sensor system (100) is configured for determining a maximum magnetic field strength to which the magnetic object (102) shall be exposed, and
- wherein the signal generation device (106) is configured for generating a signal based on the determined maximum magnetic field strength for said magnetic object (102).

Point 2. Sensor system according to point 1,
- wherein the sensor device (104) comprises a magnetic test field generator (108),
- wherein the magnetic test field generator (108) is configured for generating a magnetic test field which exerts a magnetic force that attracts the magnetic object (102), and
- wherein the sensor system (100) is configured for determining the at least one magnetic property of said magnetic object (102) by analyzing a consequence of a change of the magnetic test field due to a presence of the magnetic object (102) within the magnetic test field.

Point 3. Sensor system according to point 2,
- wherein the sensor device (104) further comprises a balance (110),
- wherein the balance (110) is configured to measure a weight of the magnetic object (102),
- wherein the sensor system (100) is configured to determine the at least one magnetic property of said magnetic object (102) based on a change of the weight of the magnetic object (102) due to the change of the magnetic test field.

Point 4. Sensor system according to any of the preceding points,
- wherein the sensor device (104) comprises a tracking device (112), which is configured for determining a distance (114) between the magnetic object (102) and the MR imaging device (200),
- wherein the sensor system (100) is configured for calculating a threshold distance (116) between the magnetic object (102) and the MR imaging device (200) based on the at least one magnetic property of the magnetic object (102), and
- wherein the sensor system (100) is configured for comparing the distance (114) between the magnetic object (102) and the MR imaging device to the threshold distance (116) and to generate the signal when the distance (114) is equal or less than the threshold distance (116).

Point 5. Sensor system according to point 4,
- wherein the sensor system (100) comprises VR and/or AR glasses (118), and
- wherein the sensor system (100) is configured for displaying the distance (114) between the magnetic object (102) and the MR imaging device (200), the threshold distance (116), a shape of the magnetic object (102), a position of the magnetic object (102), a mass of the magnetic object (102), and/or the at least one magnetic property of the magnetic object (102) on the VR and/or the AR glasses (118).

Point 6. Sensor system according to any of the preceding points,
- wherein the sensor system (100) is configured for determining based on the at least one magnetic property of the magnetic object (102) a risk value of the magnetic object (102), and
- wherein the signal generated by the signal generation device (106) depends on the risk value.

Point 7. Sensor system according to any of the preceding points,
- wherein the sensor system (100) is configured for comparing the at least one magnetic property of the magnetic object (102) to a plurality of magnetic properties of magnetic objects, which are stored in a database, and
- wherein the sensor system (100) is configured for determining based on the comparison a type of object of said magnetic object (102).

Point 8. Sensor system according to any of the preceding points,
- wherein the sensor system (100) comprises a camera (120), which is configured for generating at least one image of the magnetic object (102), and
- wherein the sensor system (100) is configured for determining the at least one magnetic property of the magnetic object (102) based on the generated image.

Point 9. Sensor system according to any of the preceding points,
- wherein the sensor system (100) is configured for determining a factor influencing the at least one magnetic property of the magnetic object, and
- wherein the factor influencing the at least one magnetic property is selected from the group comprising a mass of the magnetic object (102), a shape of the magnetic object (102), a magnetic characteristic of the magnetic object (102), a material of the magnetic object (102), an orientation of the magnetic object (102), an acceleration of the magnetic object (102), a permeability of the magnetic object (102) and/or a magnetic flux density.

Point 10. Method for detecting a magnetic object in a vicinity of a MR imaging device, the method comprising the steps of:

Determining at least one magnetic property of said magnetic object (S1),

Determining a maximum magnetic field strength to which the magnetic object may be exposed (S2), and Generating a signal based on the determined maximum magnetic field strength for said magnetic object (S3).

Point 11. Method according to point 10 further comprising the steps of:

Generating a magnetic test field (S4), and

Measuring a magnetic force of the magnetic object within the magnetic test field (S5), wherein in particular the magnetic force is based on a change of the magnetic test field due to a presence of the magnetic object and a weight of the magnetic object.

Point 12. Method according to any of the points 10-11 further comprising the steps of:

Determining a distance between the magnetic object and the MR imaging device (S6), Calculating a threshold distance between the magnetic object and the MR imaging device based on the at least one magnetic property of the magnetic object (S7), Comparing the distance between the magnetic object and the MR imaging device to the threshold distance (S8), and Generating the signal when the distance is equal or less than the threshold distance (S9).

Point 13. Computer program element, which when executed on a processor unit, instructs the processor to perform steps of the method according to any of points 10-12.

Point 14. MR imaging device (200) for acquiring MR images, comprising:

a sensor system (100) according to any of points 1-9, and a MR image acquisition device (202) configured for generating MR images.

Point 15. MR imaging device according to point 14, wherein the sensor unit (100) comprises a first sensor (204), which is configured for supervising a room in which the MRI imaging device is located, wherein the first sensor (204) comprises an optical marker unit (206), which is configured for highlighting at least an optical indicator (208), in particular a border line, on the floor based on the at least one magnetic property of said magnetic object, wherein the optical indicator (2080) is indicative of a threshold distance of the magnetic object.

LIST OF REFERENCE SIGNS

100—sensor system
102—magnetic object
104—sensor device
106—signal generation device
108—magnetic test field generator
110—balance
112—tracking device
114—distance
116—threshold distance
118—VR and/or AR glasses
120—camera
122—sound outputting device
S1—determining at least one magnetic property
S2—determining a maximum magnetic field strength
S3—generating a signal
S4—generating a magnetic test field
S5—measuring the magnetic force
S6—determining a distance
S7—calculating a threshold distance
S8—comparing the distance
S9—generating the signal

The invention claimed is:

1. A sensor system for increasing security of a use of at least one magnetic object in vicinity of a magnetic resonance (MR) imaging device, the sensor system comprising:

at least one sensor device, a signal generation device, wherein the sensor device is configured for determining at least one magnetic property of said magnetic object, wherein the sensor system is configured for determining a maximum magnetic field strength to which the magnetic object shall be exposed based on the at least one determined magnetic property of said magnetic object, wherein the sensor device comprises a tracking device, which is configured for determining a distance between the magnetic object and the MR imaging device, wherein the sensor system is configured for calculating a threshold distance between the magnetic object and the MR imaging device based on the at least one determined magnetic property of the magnetic object and/or the determined maximum magnetic field strength, wherein for the calculation of the threshold distance, the sensor system is configured for calculating a total magnetic field strength based on a model that takes into account of both static and gradient fields of the MR imaging device, determining a location of the magnetic object at which the calculated total magnetic field strength is equal to the determined maximum magnetic field strength, and defining the threshold distance as a distance between the determined location of the magnetic object and a location of the MR imaging device, and wherein the sensor system is configured for comparing the distance between the magnetic object and the MR imaging device to the threshold distance, and wherein the signal generation device is configured for generating a signal when the distance is equal or less than the threshold distance.

2. The sensor system according to claim 1, wherein the sensor device comprises a magnetic test field generator, wherein the magnetic test field generator is configured for generating a magnetic test field which exerts a magnetic force that attracts the magnetic object, wherein the magnetic test field generator is configured for changing the magnetic test field over a predetermined time period, and wherein the sensor system is configured for determining the at least one magnetic property of said magnetic object by analyzing a deviation of the magnetic test field during the change of the magnetic test field due to a presence of the magnetic object within the magnetic test field.

3. The sensor system according to claim 2, wherein the sensor device further comprises a balance, wherein the balance is configured to measure a weight of the magnetic object, wherein the sensor system is configured to determine the at least one magnetic property of said magnetic object based on a change of the weight of the magnetic object due to the change of the magnetic test field.

4. The sensor system according to claim 1,
wherein the sensor system comprises VR and/or AR glasses, and
wherein the sensor system is configured for displaying the distance between the magnetic object and the MR imaging device, the threshold distance, a shape of the magnetic object, a position of the magnetic object, a mass of the magnetic object, and/or the at least one magnetic property of the magnetic object on the VR and/or the AR glasses.

5. The sensor system according to claim 1,
wherein the sensor system is configured for determining based on the at least one magnetic property of the magnetic object risk value of the magnetic object, and
wherein the signal generated by the signal generation device depends on the risk value.

6. The sensor system according to claim 1,
wherein the sensor system is configured for comparing the at least one magnetic property of the magnetic object to a plurality of magnetic properties of magnetic objects, which are stored in a database, and
wherein the sensor system is configured for determining based on the comparison a type of object of said magnetic object.

7. The sensor system according to claim 1,
wherein the sensor system comprises a camera, which is configured for generating at least one image of the magnetic object, and
wherein the sensor system is configured for determining the at least one magnetic property of the magnetic object based on the generated image.

8. The sensor system according to claim 1,
wherein the sensor system is configured for determining a factor influencing the at least one magnetic property of the magnetic object, and
wherein the factor influencing the at least one magnetic property is selected from the group comprising a mass of the magnetic object, a shape of the magnetic object, a magnetic characteristic of the magnetic object, a material of the magnetic object, an orientation of the magnetic object, an acceleration of the magnetic object, a permeability of the magnetic object and/or a magnetic flux density.

9. A magnetic resonance (MR) imaging device for acquiring MR images, the device comprising:
a sensor system according to claim 1, and
a MR image acquisition device configured for generating MR images.

10. The MR imaging device according to claim 9,
wherein the sensor unit comprises a first sensor, which is configured for supervising a room in which the MRI imaging device is located,
wherein the first sensor comprises an optical marker unit, which is configured for highlighting at least an optical indicator, in particular a border line, on the floor based on the at least one magnetic property of said magnetic object, wherein the optical indicator is indicative of a threshold distance of the magnetic object.

11. A method for increasing security of a use of a magnetic object in a vicinity of a MR imaging device, the method comprising the steps of:
determining at least one magnetic property of said magnetic object,
determining maximum magnetic field strength to which the magnetic object may be exposed based on the at least one determined magnetic property of said magnetic object,
determining a distance between the magnetic object and the MR imaging device,
calculating a threshold distance between the magnetic object and the MR imaging device based on the at least one determined magnetic property of the magnetic object and/or the determined maximum magnetic field strength,
wherein for the calculation of the threshold distance, the method further comprises:
calculating a total magnetic field strength is calculated based on a model that takes into account of both static and gradient fields of the MR imaging device,
determining a location of the magnetic object at which the calculated total magnetic field strength is equal to the determined maximum magnetic field strength, and
defining the threshold distance as a distance between the determined location of the magnetic object and a location of the MR imaging device,
comparing the distance between the magnetic object and the MR imaging device to the threshold distance, and
generating a signal when the distance is equal or less than the threshold distance.

12. The method according to claim 11 further comprising:
generating a magnetic test field, and
measuring a magnetic force of the magnetic object within the magnetic test field,
wherein the magnetic force is based on a change of the magnetic test field due to a presence of the magnetic object and a weight of the magnetic object.

13. A computer program stored on a non-transitory computer readable medium, which when executed on a processor unit, instructs the processor to perform the method according to claim 11.

* * * * *